United States Patent [19]
Tadokoro et al.

[11] Patent Number: 6,080,206
[45] Date of Patent: Jun. 27, 2000

[54] METHOD OF LAYING OUT INTERCONNECTIONS

[75] Inventors: Hirofumi Tadokoro; Kenji Arai, both of Tokyo, Japan

[73] Assignee: Oki Electric Industry Co., Ltd., Tokyo, Japan

[21] Appl. No.: 08/947,153

[22] Filed: Oct. 8, 1997

[30] Foreign Application Priority Data

Dec. 27, 1996 [JP] Japan ................................ 8-350186

[51] Int. Cl.⁷ .................................................. G06F 17/50
[52] U.S. Cl. ................................ 716/10; 716/13; 716/7
[58] Field of Search .................................. 364/488, 489, 364/490, 491; 395/500.01–500.2; 716/1–21

[56] References Cited

U.S. PATENT DOCUMENTS

| | | | |
|---|---|---|---|
| 5,513,124 | 4/1996 | Trimberger et al. | 395/500.08 |
| 5,557,779 | 9/1996 | Minami | 395/500.07 |
| 5,648,911 | 7/1997 | Grodstein et al. | 395/500.19 |
| 5,648,913 | 7/1997 | Bennett et al. | 395/500.07 |
| 5,715,408 | 2/1998 | Chidhambarakirshnan | 710/126 |
| 5,838,581 | 11/1998 | Kuroda | 716/8 |
| 5,880,971 | 3/1999 | Dangelo et al. | 395/500.07 |
| 5,917,729 | 6/1999 | Naganuma et al. | 395/500.11 |
| 6,006,023 | 12/1999 | Higashida | 395/500.07 |

OTHER PUBLICATIONS

Tanizawa and Kawahara "Clock Driven DEsign Method (CDDM) for Deep Sub–Micron ASICs," Proceedings of the Eigth Annual IEEE Internatinal ASIC Conference and Exhibit, Sep. 18–22, 1995, p. 241–244, Sep. 1995.
El–Amawy and Maheshwar "Synchronous Clocking Schemes for Large VLSI Systems," 1993 Conference Record of the 27th Asilomar Conference on Signals, Systems and Computers, Nov. 1993.
Ahrens et al. "An FPGA Family Optimized for High Densities and Reduced Routing Delay," Proceedings of the IEEE 1990 Custom Integrated Circuits Conference, May 1990.
Wang and Chen "A Simultaneous Placement and Global Routing Algorithm for an FPGA with Hierarchical Interconnection Structure," ISCAS '96., Connecting the World., 1996 IEEE International Symposium on Circuits and Systems, May 1996.
Saigo et al. "Clock Skew Reduction Approach for Standard Cell," Proceedings of the IEEE 1990 Custom Integrated Circuits Conference, May 1990.
Dai et al. "Cost–Driven Layout for Thin–Film MCMs," MCM–93, Proceedings., 1993 IEEE Multi–Chip Module Conference, Mar. 1993.
Hojati "Layout Optimization by Pattern Modification," Proceedings., 27th ACM/IEEE Design Automation Conference, 1990, Jun. 1990.
Mowchenko and Yang "Optimizing Wiring Space In Slicing Floorplans," Proceedings.,Fifth Great Lakes Symposium on VLSI, 1995, Mar. 1995.

*Primary Examiner*—Paul R. Lintz
*Assistant Examiner*—Phallaka Kik
*Attorney, Agent, or Firm*—Wenderoth, Lind & Ponack, L.L.P.

[57] ABSTRACT

To implement a method of laying out interconnections, which is capable of reducing a skew value of a predetermined signal and a delay in predetermined signal to the utmost, a region intended for a wiring layout employed in a CAD system is divided into a plurality of subregions and wiring regions dedicated to the predetermined signal in the respective subregions are set. The number of driver's stages in the respective subregions is set and the region is enlarged with the adjacent subregions identical in number of driver's stages as virtual subregions. Thus, the layout of wiring between the subregions is set.

10 Claims, 13 Drawing Sheets

365

375

METHOD OF LAYING OUT INTERCONNECTIONS

BACKGROUND OF THE INVENTION

1. Field of the Invention

This invention relates to a method of designing an LSI logic circuit using a CAD (Computer Aided Design) used to determine a layout such as the placement of interconnections and circuit elements used for LSI design, particularly laying out interconnections employed in the LSI logic circuit.

2. Description of the Related Art

Various problems arise upon design of an LSI logic circuit using a CAD system, which comprises various logic elements such as flip-flops, inverters, etc. For example, each element logic elements to be activated in synchronism with a clock signal must be set so that the clock signal is transferred thereto without a clock skew developed due to variations in signal delay (or within an allowable range). In this case, wiring capacitance of each clock interconnection used to transfer a clock signal inputted to the LSI logic circuit from the outside to each logic element activated in synchronism with the clock signal, and a clock skew developed due to a wiring resistance thereof present a problem in particular.

Therefore, various methods for laying out interconnections have heretofore been used. FIGS. 18 through 21 respectively show wiring layout methods which have heretofore been used. Incidentally, FIGS. 18 through 21 are shown as LSI logic circuits each composed of an gate array LSI.

FIGS. 18 and 19 respectively illustrate a wiring layout method called "trunk system". In FIGS. 18 and 19, an interconnection (hereinafter called "trunk") 4 dedicated to a clock signal is laid out substantially in the center of a core region (where a logic circuit is configured) 2 surrounded by an input/output element region 3 located around an LSI chip for an LSI logic circuit 1. In FIG. 18, the clock signal inputted from the outside is transferred to the trunk 4 through a drive element (hereinafter called "driver") 5-1 or 5-2 formed within the input/output element region 3. If the clock signal is transferred to the main trunk 4 from both the drivers 5-1 and 5-2 in this case, then a signal delay and a clock skew can be reduced even if the clock signal is taken out or selected from any position of the trunk 4. In FIG. 19, drivers 8-1 through 8-4 are provided within a core region and a clock signal is transferred to a main trunk 4 from various positions of the main trunk 4. In the method shown in FIG. 19, a signal delay and a clock skew can be lessened by placing the drivers 8-1 through 8-4 so that they are well balanced therebetween. In doing so, the clock signal can be transferred to respective logic elements 7 through a subtrunk interconnection 6 that has branched off from the trunk 4.

FIGS. 20 and 21 respectively show wiring layout methods called "tree systems". FIG. 20 illustrates an H-type tree system. In FIG. 20, an H-type interconnection 51 is decided from a main driver 11 that receives therein a clock signal inputted from the outside. At this time, the main driver 11 is positioned substantially in the center of the H-type interconnection 51. The clock signal is transferred to respective H-type interconnections 52 through 55 through drivers 12-1 through 12-4 provided at leading ends of the interconnection 51. Thus, respective logic elements to be disposed at leading ends of the H-type interconnections 52 through 55 and the main driver 11 can be rendered identical in both wiring length and number of driver's stages to one another. Referring to FIG. 21, the next drivers 14-1 through 14-4 are disposed substantially in the centers of the respective sides forming a rhombus with a main driver 13 as the center, as viewed from the main driver 13. The main driver 13 and the respective drivers 14-1 through 14-4 are respectively electrically connected to each other by an interconnection 61. If necessary, for example, a rhombus is formed with the driver 14-4 as the center and the same processing as described above is executed. Thereafter, the driver 14-4 and the next drivers 15-1 through 15-3 are respectively electrically connected to each other by an interconnection 62. Since the wiring lengths and the numbers of driver's stages between the main driver 11 or 13 and the respective logic elements can be uniformly set by doing so, a signal delay and a clock skew can be reduced.

However, the above-described methods have the following problems respectively. FIGS. 22 and 23 are views for explaining the problems.

There may be cases in which, for example, configurations 20-1 and 20-2 called "macrocells" are disposed within a core region 2 in FIG. 22. Each of the macrocells is a circuit configuration designed in advance and registered in a computer and is one such as a memory or a CPU. Since the large macrocells 20-1 and 20-2 are laid out, they occupy the core region extensively in FIG. 22. Therefore, the trunk 4 cannot be set and the region for constructing the tree results in a shape deformed in L form as shown in FIG. 22, e.g., trapezoidal form. Thus, substantial limitations are imposed on the wiring layout.

Referring to FIG. 23, a small region 21 is defined between a macrocell 20-3 and an input/output element region 3 when the macrocell 20-3 must be laid out away from the input/output element region 3. When logic elements to receive a clock signal in synchronism with other logic elements must be laid out within the region 21, it becomes eventually necessary to provide interconnections that bypass the macrocell 20-3 even if the trunk and tree systems are used.

With the foregoing problems in view, it is therefore an object of the present invention to allow respective logic elements activated in synchronism with a predetermined signal to be laid out and wired easily even if configurations like macrocells are laid out in any form and to reduce a wiring delay and a clock skew to the utmost.

SUMMARY OF THE INVENTION

According to one aspect of the present invention, for achieving the above-described object, there is provided a method of laying out interconnections employed in an LSI logic circuit having a plurality of logic elements within a preset region of an LSI chip, wherein the logic elements are respectively activated in synchronism with at least one predetermined signal through one or more drive elements, which comprises the following steps of:

a step for dividing the region into a plurality of subregions;

a step for setting wiring regions used for the transfer of the signal within the region;

a step for setting, within the individual subregions, the number of drive elements to be interposed between input position of the signal to the respective subregions and a transfer position of the signal to the logic elements within the region and the layout of the drive elements;

a step for setting the layout of the drive elements for the transfer of the signals between the adjacent respective subregions and wiring between the drive elements using the set wiring regions, based on information about the number and the layout of the drive elements in the set respective subregions; and a step for setting wiring between the drive elements using the layout of the respective drive elements in the individual subregions and the set wiring regions.

According to another aspect of the present invention, there is provided a method of laying out interconnections, wherein the layout of drive elements in individual subregions and the wiring between the drive elements are conducted using an H-type clock tree.

According to a further aspect of the present invention, there is provided a method of laying out interconnection, further including:

a step for configuring the H-type clock tree within a substantially square region in which the region is dividable into $2^n$ in the vertical or horizontal direction; and a step for selecting only a divided region including main drive elements of the configured H-type clock tree.

According to a still further aspect of the present invention, there is provided a method of laying out interconnections, further including:

a step for aligning a region for a reference potential supply line with the wiring regions used to transfer the signal and placing the region for the reference potential supply line in a wiring layer different from a wiring layer for laying out the wiring regions.

According to a still further aspect of the present invention, there is provided a method of laying out interconnections, further including:

a step for setting other signal interconnections wired in the neighborhood of the wiring regions so as to be spaced by a predetermined interval from the wiring regions after the wiring regions used for the transfer of the signal have been set.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
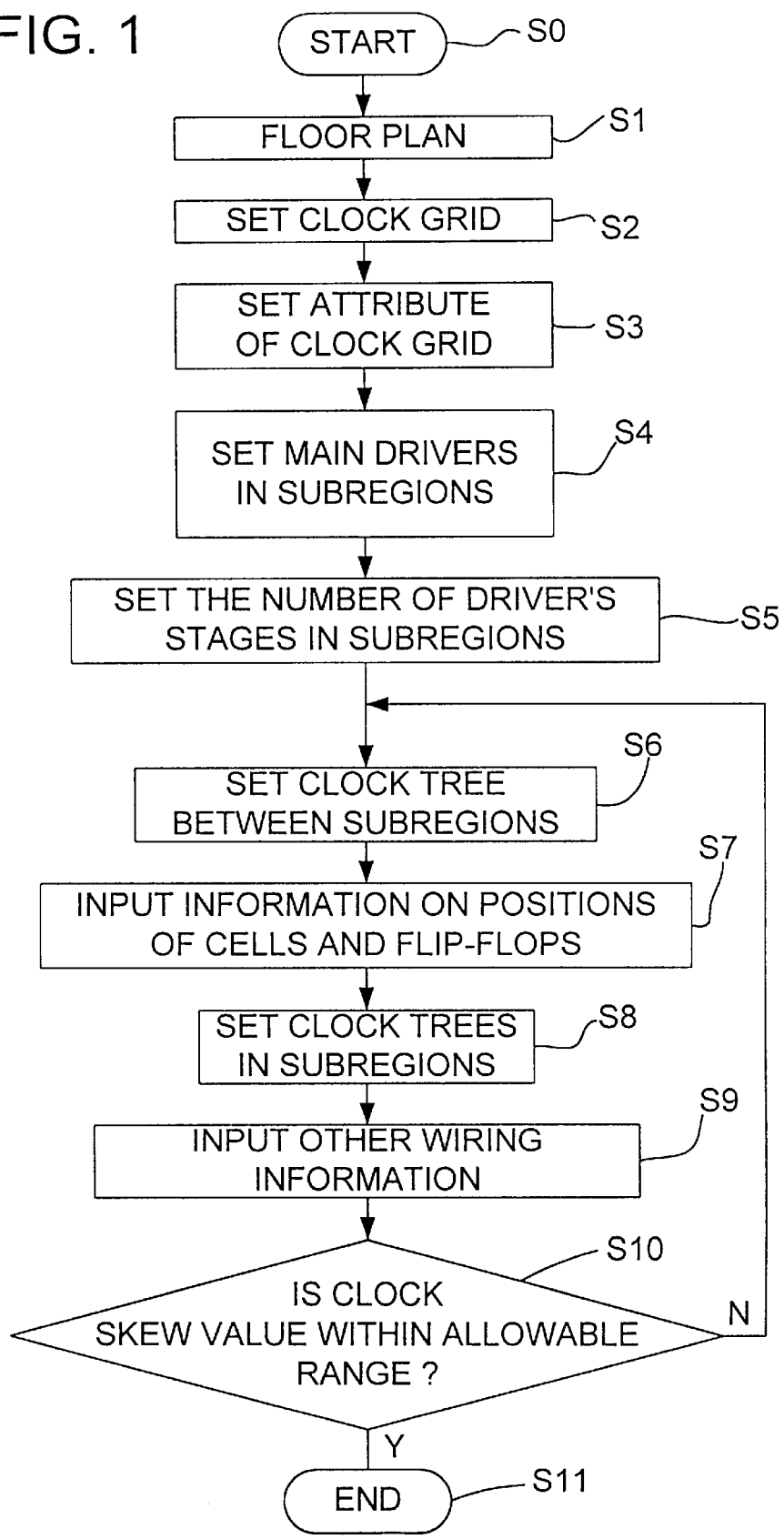
FIG. 1 is a flowchart for describing a wiring layout showing one embodiment of the present invention.

Preferred embodiments of the present invention will hereinafter be described in detail with reference to the accompanying drawings. FIG. 1 is a flowchart for describing a procedure of a wiring layout process at the time that the present invention is applied to a CAD system device. In the present embodiment, signals to be synchronized by respective logic elements will be explained as clock signals.

Now consider in Step S0 that the need for designing a wiring layout for a logic circuit has come about. At this time, information necessary for layout design is inputted in advance. The information includes, for example, connection information such as restrictions on electrical connections between a plurality of logic elements or macrocells or the like, information about a decision as to a logic circuit having a multilayer interconnection structure, information on determining to which layer a wiring path or route should be set, information on which position in a lower layer a wiring region should be laid out, information about how many clock signals should be used, a method (tree system or trunk system) used for setting connecting paths of necessary interconnections, etc. Incidentally, these information do not necessarily require their input in Step S0. They may be inputted as needed on all such occasions.

Next, information about a floor plan is inputted in Step S1. The floor plan is a step for determining how to dispose macro cells or other circuit blocks on a chip of a logic circuit among every macro cell or other circuit blocks.

Figure 2:
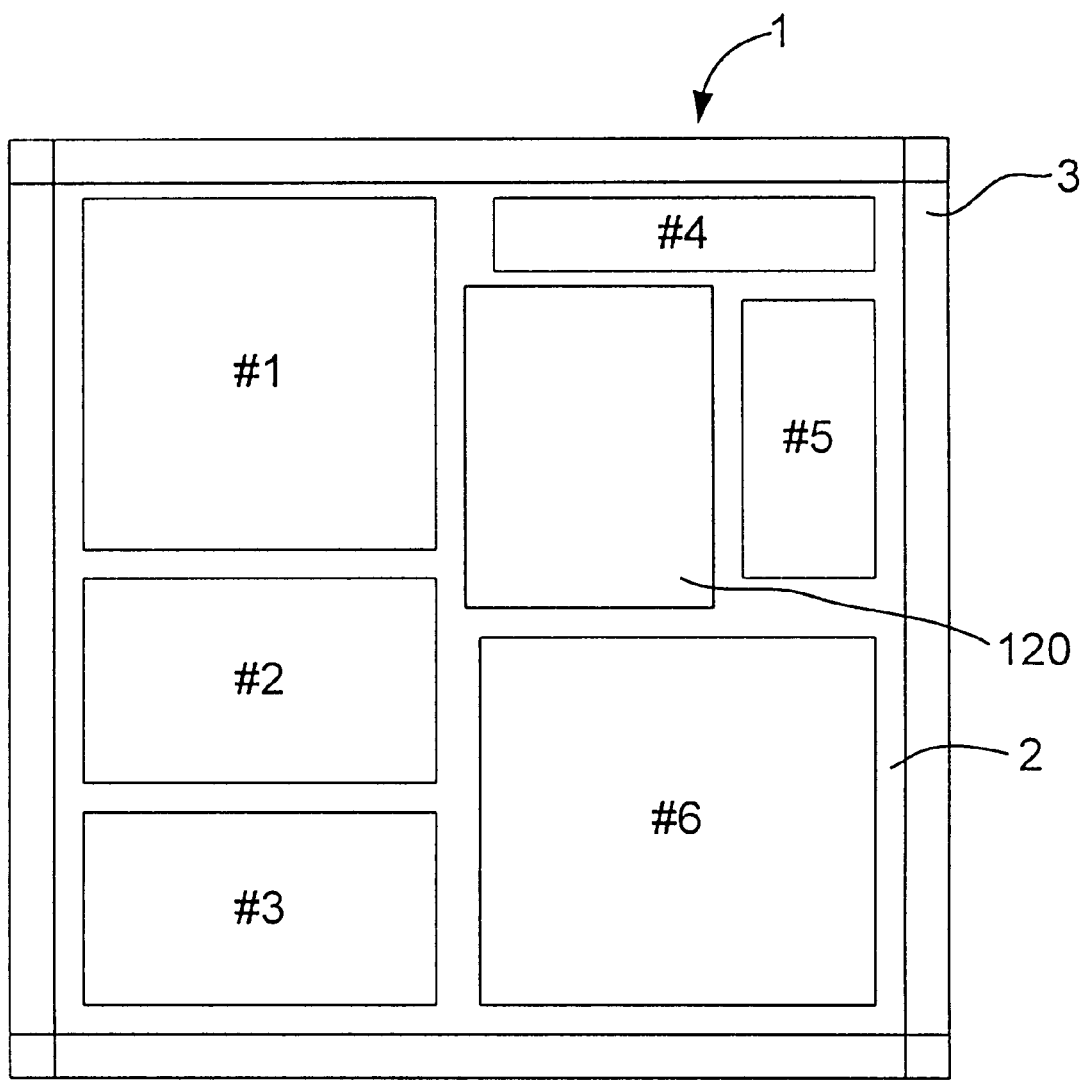
FIG. 2 is a view showing a floor plan for a chip of an LSI logic circuit employed in the embodiment of the present invention.

The design of the floor plan inputted here will now be described using FIG. 2. FIG. 2 shows an example of a floor plan with respect to a chip surface of a gate array LSI 1. In FIG. 2, the floor plan is designed for a core region 2 corresponding to a region to lay out interconnections, which is surrounded by an input/output element layout region 3. Reference numeral 120 indicates a macro cell. A core region other than a region where the macro cell 120 has been disposed, corresponds to a region in which a logic structure designed using standard cells is disposed. This region is divided into rectangular regions #1 through #6 corresponding to subregions. In FIG. 2, the region division is made to design rectangular regions around every circuit configuration as in the case of, for example, a region in which a serial-parallel converter circuit is designed and a region in which a decoder is designed. This region division may be done in parts of very fine configurations. However, the setting of the rectangular regions is suitable when interconnections are laid out within the region, using an H-tree system or the like in the subsequent process. In FIG. 2, slight spaces are defined among the respective regions #1 through #6. However, no problem arises even if the above region is divided into the respective regions so that they adjoin each other. Due to the definition of the spaces between the regions, an effect can be brought about in that the spaces can be ensured as regions for disposing drivers used for the supply of clock signals between adjacent respective regions to be described later. Due to the nondefinition of the spaces therebetween, the drivers used for the supply of the clock signals between the adjacent regions are set inside any of the adjacent regions. However, an effect can be brought about in that the core region can be utilized more effectively.

Clock grids are next set in Step S2. In the present embodiment, the clock grids indicate dedicated wiring regions for transmitting clock signals to respective logic elements constituting a logic circuit.

Figure 3:
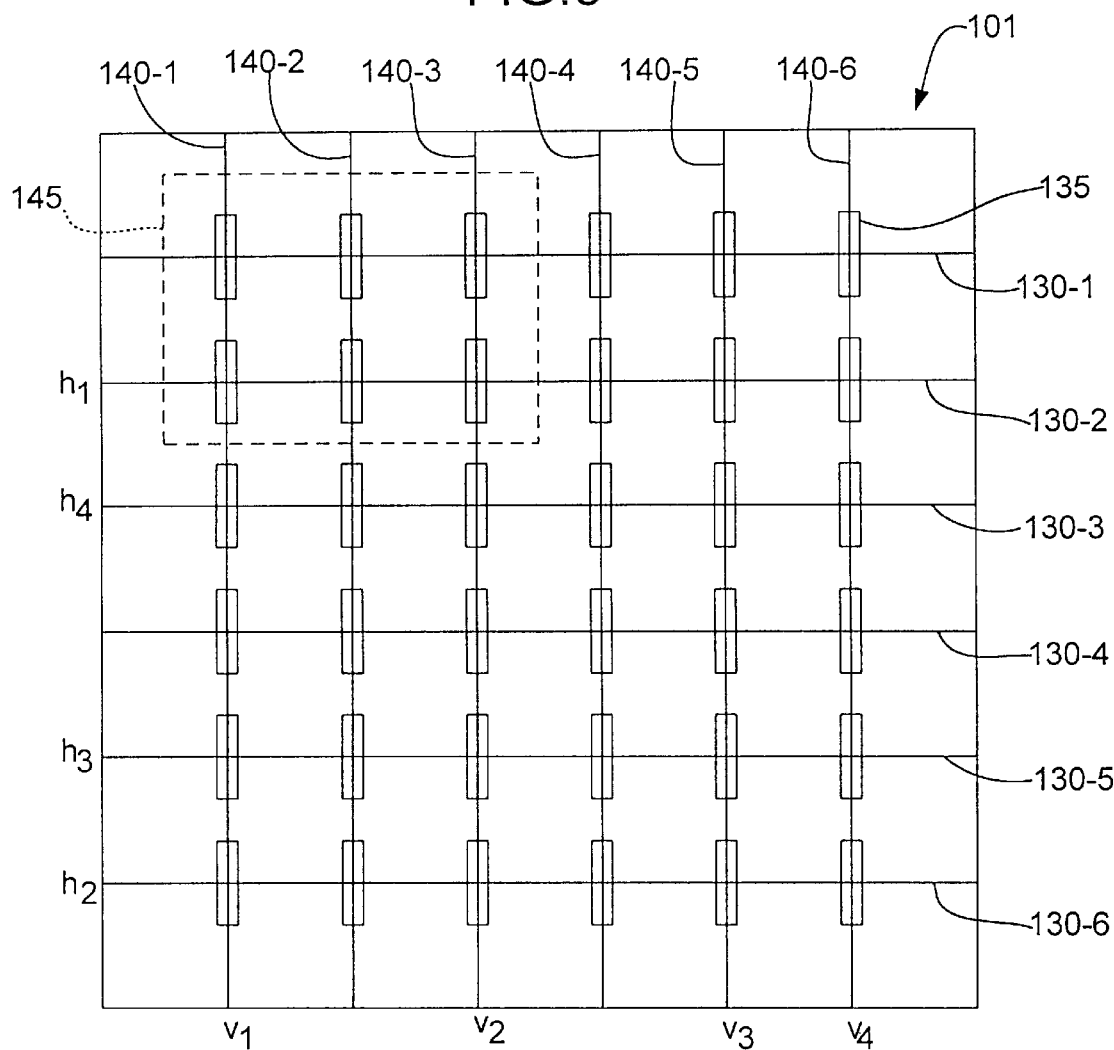
FIG. 3 is a view for describing the setting of clock grids in subregions region-divided by the floor plan shown in FIG. 2.

The setting of the clock grids will be explained with reference to FIGS. 3 and 4. FIG. 3 is a view illustrating the region #1 shown in FIG. 2. Now consider that in the logic circuit employed in the present embodiment, metal layers are provided at third and fourth layers under a four-layered structure in Step S0 and these layers are set as wiring dedicated layers for providing electrical connections between the respective logic elements. Thus, wiring layout regions 130-1 through 130-6 extending in the horizontal direction will be defined as the metal layers corresponding to the third layers and wiring layout regions 140-1 through 140-6 extending in the vertical direction will be defined as the metal layers corresponding to the fourth layers. Incidentally, elements illustrated in the form of slender rectangles respectively indicate contact portions that make contact between a substrate or a well region in the substrate and a ground potential or a source potential. Now, regions for laying out interconnections dedicated to clocks are set. In FIG. 3, the wiring regions 130-2, 130-3, 130-5 and 130-6 indicated by h1 through h4 and the wiring regions 140-1, 140-3, 140-5 and 140-6 indicated by v1 through v4 are respectively set in the horizontal and vertical directions as wiring dedicated regions for clock signals.

Figure 4:
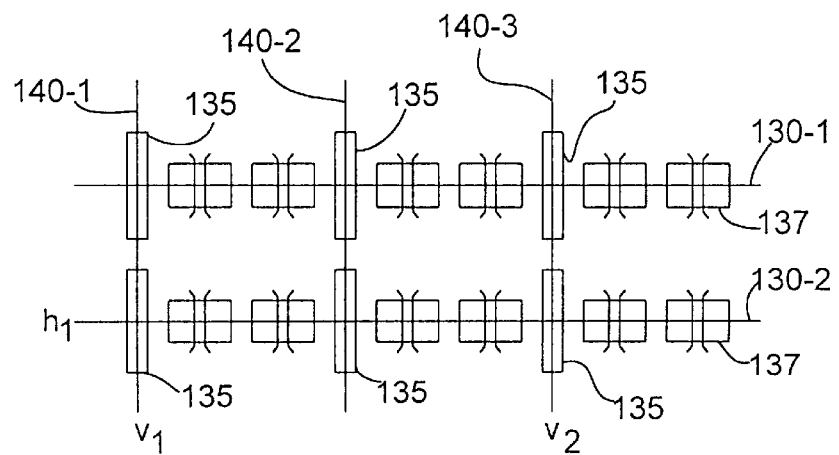
FIG. 4 is a partially enlarged view of FIG. 3.

FIG. 4 is an enlarged view of a portion 145 indicated by a dotted line shown in FIG. 3. In accordance with the wiring layout information inputted in Step S0, as shown in FIG. 4, the wiring regions 130-1 and 130-2 extending in the horizontal direction are respectively disposed at positions where they cross over substantially the centers of unit cells 137, whereas the wiring regions 140-1 through 140-3 extending in the vertical direction are respectively disposed at positions where they pass over the contact portions 135. Of these, the wiring regions 130-2, 140-1 and 140-3 are set as the clock wiring dedicated regions and other wiring regions 130-1 and 140-2 are set as regions which are not used as other wiring regions or interconnections for providing connections between the logic elements, for example. The set information is stored as information to be used upon the subsequent wiring. Now consider that conditions for designing the logic elements using the unit cells are set to the regions having no interconnections at the upper layer (third or fourth layer). If the wiring regions dedicated to the clock signals, and the like are set in advance in this case, then a clock wiring path or route corresponding to the distance shortest to each logic element can be freely set without being affected by the layout of each unit cell. Although one region #1 has been described in the present embodiment, the clock wiring route may be set similarly even in the case of each of the regions #2 through #6. Alternatively, the clock wiring dedicated regions may be set as the entire core region 2 as described above. At this time, the above-described setting cannot be applied to the macro cell layout region. Thus, this can be processed by determining information for setting each clock grid in the macro cell layout region as inapplicable or deleting it.

Next, the attribute of each clock wiring region set in Step S2 is set in Step S3. The term attribute indicates the type of either of two separate clock signals at the time that the two separate clock signals are supplied as clock signals in the present embodiment. Alternatively, the attribute is determined as each of regions for clock interconnections used to provide electrical connections in each of the regions #1 through #6 or as each of regions for clock interconnections used to provide electrical connections between the respective regions #1 through #6. When the predetermined signal is used as the clock signal as in the present embodiment, the attribute may be defined as the type of signal. If the wiring regions are used for the supply of one clock signal C1 to h1, h3, v1 and v3 or as clock signal connecting interconnections in each region in FIG. 3, then the wiring regions 130-2, 130-5, 140-1 and 140-5 serve as regions dedicated to the clock signal C1 or clock wiring dedicated regions in each region. On the other hand, if the wiring regions are used for the supply of a clock signal C2 to h2, h4, v2 and v4 or as clock wiring dedicated regions for providing electrical connections between the regions, then the wiring regions 130-3, 130-6, 140-3 and 140-6 serve as regions dedicated to the clock signal C2 or clock wiring dedicated regions used for providing electrical connections between the regions. Thus, if the attribute is set, then the clock signals different in attribute do not collide with each other on the wiring regions dedicated to the clock signals. It is also possible to further improve the degree of freedom of wiring for a plurality of clock signals and easily set the wiring for the clock signals.

Figure 5:
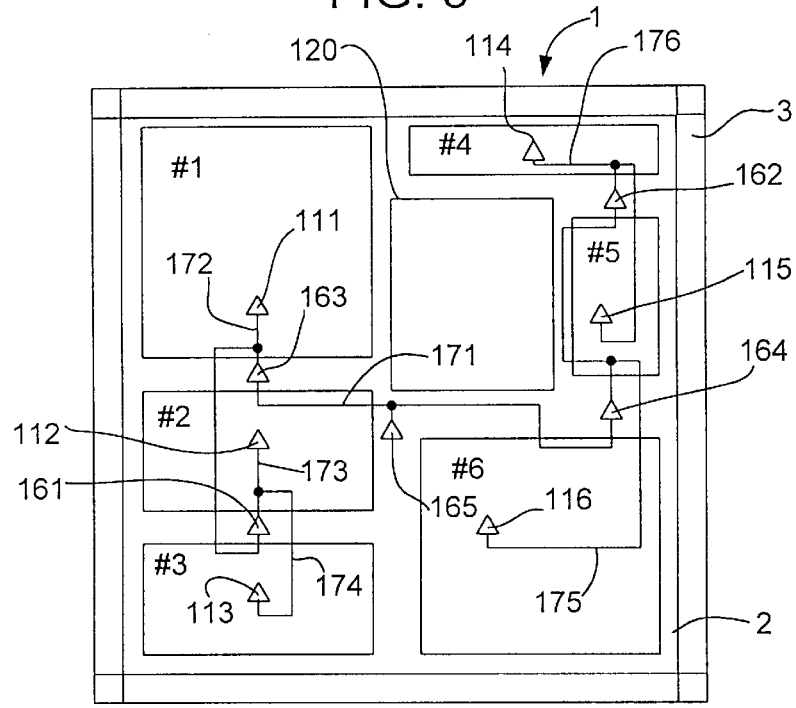
FIG. 5 is a view illustrating a wiring layout between subregions employed in the embodiment of the present invention.

Next, main drivers in the respective regions #1 through #6 are set in Step S4. The main drivers are those for firstly receiving a clock signal in the individual regions #1 through #6. However, when drivers for transmitting a clock signal between the respective regions #1 through #6 are set within their corresponding regions, they are taken as drivers for firstly receiving the clock signal exclusive of the drivers for transmitting the clock signal. Referring to FIG. 5, a main driver 111, a main driver 112, a main driver 113, a main driver 114, a main driver 115 and a main driver 116 are set in regions #1, #2, #2, #4, #5 and #6 respectively.

Next, the number of stages of the drivers in the respective regions #1 through #6 is set in Step S5. The number of the stages of the drivers corresponds to the number of drivers necessary for those (such as flip-flops or the like) corresponding to logic elements farthest from the main drivers, which are to be activated in synchronism with a clock signal. The number of the stages of the drivers is equal to a number including the main drivers. The number of the stages of the drivers is set based on the sizes of the individual regions #1 through #6 and the number of the logic elements such as the flip-flops or the like to be activated in synchronism with the clock signal. In the present embodiment, the number of the driver's stages is set to 3 in the region #1, the number of the driver's stages is set to 2 in the region #2, the number of the driver's stages is set to 2 in the region #3, the number of the driver's stages is set to 2 in the region #4, the number of the driver's stages is set to 2 in the region #5 and the number of the driver's stages is set to 3 in the region #6. The difference in number of driver's stages between the adjacent regions may preferably be set to 0 or 1 or so. When a method according to the present invention to be described later is used, the region division in Step S0 referred to above may more preferably be carried out while considering to which number the number of the stages of the drivers in the individual regions corresponds.

Next, a clock tree among the respective regions #1 through #6 is set in Step S6. A method of setting the clock tree will be explained with reference to FIG. 6.

Figure 6A:
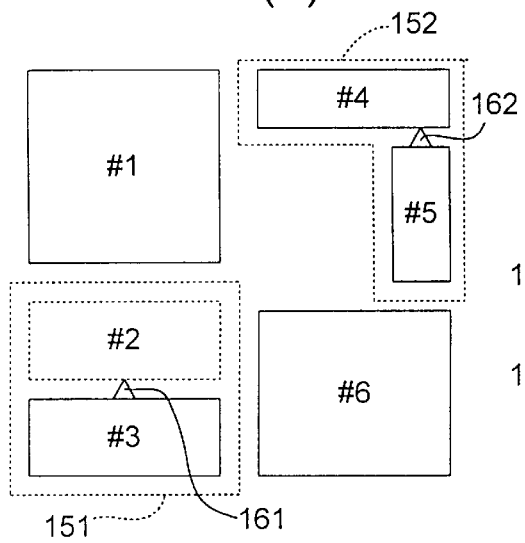
FIGS. 6a and 6b are views for explaining a procedure for setting drivers used for wiring between the subregions employed in the embodiment of the present invention.

As shown in FIG. 6(a), those stages identical in number to one another are first found out from the adjacent regions as shown in FIG. 6(a). The adjacent two regions will be defined as one virtual region. For example, the regions #2 and #3 in which the number of driver's stages is two, will be defined as one virtual region 151. Further, the regions #4 and #5 in which the number of driver's stages is two, will be defined as one virtual region 152. Drivers 161 and 162 used for providing electrical connections between the regions are respectively set to the regions 151 and 152. The drivers 161 and 162 are respectively disposed at the boundary between the two regions for forming the virtual regions 151 and 152 or in the neighborhood thereof. If they are laid out in this way, then they assume uniform positions in the adjacent respective regions (corresponding to, for example, the regions #2 and #3 in the virtual region 151). With respect to the number of the stages of the drivers in the virtual regions 151 and 152, the numbers of the stages of the drivers (the regions #2 through #5 are set to two stages in the present embodiment) in the regions constituting the virtual regions respectively include, and are thus increased by, the drivers 161 and 162. Thus, the numbers of the stages of the drivers in the virtual regions 151 and 152 can be considered to both be three. When the adjacent regions are different in number of driver's stages from each other, the number of the stages of the drivers in the region in which the driver's stages have been set low in number, may be increased so as to create adjacent regions identical in number of driver's stages to each other.

Figure 6B:
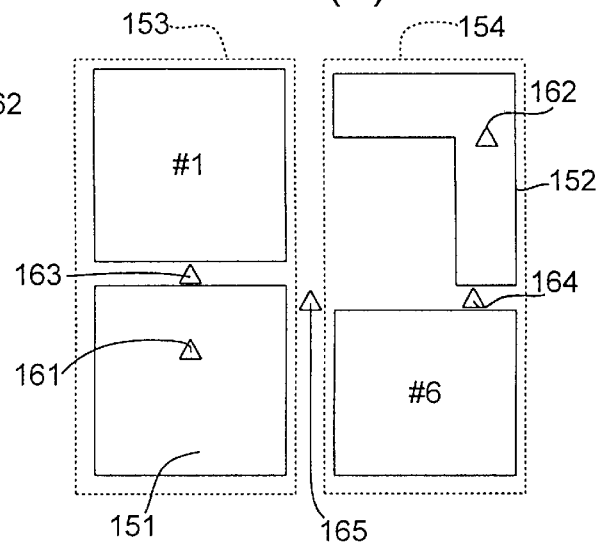

Further, those identical in number of driver's stages in adjacent regions are found out in the virtual region 151, the virtual region 152 and the remaining regions #1 and #6 to create virtual regions as shown in FIG. 6(b) in the same manner as described above. For example, the virtual region 151 and the region #1 in which the number of driver's stages is three, are defined as one virtual region 153, and the virtual region 152 and the region #6 in which the number of driver's stages is three, are defined as one virtual region 154. Drivers 163 and 164 used for providing electrical connections between the regions are respectively set to the regions 153 and 154. The drivers 163 and 164 are respectively disposed at the boundary between the two regions for forming the virtual regions 153 and 154 or in the neighborhood thereof. With respect to the numbers of the stages of the drivers in the virtual regions 153 and 154, the numbers of the stages of the drivers (the virtual regions 151 and 152, and the regions #1 through #6 are respectively set to three stages in the present embodiment) in the regions constituting the virtual regions respectively include, and are thus increased by, the drivers 163 and 164. Thus, the numbers of the stages of the drivers in the virtual regions 153 and 154 can be considered to both be four. If the numbers of stages of drivers in the remaining two regions are identical to each other after the regions have been enlarged in this way, then a driver 165 is disposed at the boundary between the two regions or in the neighborhood thereof. This driver 165 is set in a core region excluding a macrocell as a driver firstly supplied with a clock signal from the outside. When the numbers of the stages of the drivers in the two regions differ from each other after the enlargement of the regions, the drivers may be added to only the region in which the driver's stage is small in number, as described above. Thus, the difference in number of driver's stages between the regions left finally after the enlargement of the regions is set so as to be absent (or reach one stage or so) upon enlarging such regions.

Since the drivers 161 through 165 can be disposed in this way, the clock tree among the respective regions #1 through #6 can be constructed as shown in FIG. 5. Namely, the driver 165 receives the clock signal from the outside and transfers it to the next drivers 163 and 164 through an interconnection 171. The driver 163 transfers the clock signal to the drivers 111 and 161 through an interconnection 172. Further, the driver 161 transfers the clock signal to the drivers 112 and 113 through an interconnection 173. Similarly, the driver 164 transfers the clock signal to the drivers 116 and 162 through an interconnection 175. Further, the driver 162 transfers the clock signal to the drivers 114 and 115 through an interconnection 176. Thus, the difference in number of driver's stages between the respective regions #1 through #6 can be adjusted by the creation of the clock tree among the regions. Therefore, the stages of the drivers extending from the main drivers to the farthest logic elements in the individual regions #1 through #6 as viewed from the driver 165 can be identical in number to each other. Incidentally, the interconnections 171 through 176 are wired using the clock grid regions set in Steps S2 and S3. Upon this wiring processing, the interconnections are basically set in the shortest distance and set while adjusting wiring lengths between the drivers in consideration of a wiring delay and the like. Further, when each wiring length is excessively long, the following adjustment is made. The maximum length of each interconnection between the drivers is first inputted as L in advance in Step S0. When the wiring length between the adjacent drivers is found to have exceeded the maximum length L from this information, one driver is further added between the drivers. Thus, the wiring length is set so as not to exceed the maximum wiring length L. The adjacent drivers can be more uniformly set in wiring length therebetween by doing so. Thus, a wiring delay developed due to a wiring capacitance or resistance can be reduced. Therefore, the macrocell 120 can be disposed without any problem and the number of driver's stages can be set to an easy and uniform number.

Next, information about the layout of cells and flip-flops or the like in the respective regions #1 through #6 is inputted in Step S7. Upon inputting the layout information, predetermined cells or flip-flops are laid out within the subregions divided in accordance with the floor plan in Step S1. Further, the layout information is inputted so that the cells or flip-flops are disposed in a state in which the placement of the drivers set in Steps S4 and S6 remains fixed. Since the regions dedicated to the clock interconnections are ensured as described above, the cells and flip-flops are easily laid out and set upon inputting the layout information.

Next, clock trees in the respective regions #1 through #6 are set in Step S8. The clock trees in the individual regions may be set in accordance with the conventional method. However, since the rectangular regions are established, an H-type tree system or a rhombus tree system can be easily adopted. At this time, the wiring is installed using the clock grid regions set in Steps S2 and S3. In doing so, the clock signal can be transferred to the corresponding logic element to be activated in synchronism with the clock signal under the shortest wiring length and the minimum number of driver's stages even within the individual regions. Thus, the transfer of the clock signal can be easily done in good balance over the entire LSI logic circuit.

Next, information about the remaining interconnections (such as interconnections between the asynchronous logic elements) is inputted in Step S9. This wiring is installed using the wiring regions other than the clock grid regions set in Step S2. Thus, the wiring can be easily installed without having the care of collision with the clock signal. Even if the wiring is set as the clock grids, the clock grid regions not used as for the transfer of the clock signal may be used as regions for the remaining interconnections. Now, the clock grid regions between the subregions may be left (they will not be used as the regions for the remaining interconnections). In doing so, the clock wiring using the clock grids between the subregions can be easily adjusted upon adjustments to a clock skew value that does not satisfy an allowable range thereof in Step S10 corresponding to the next process.

Next, in Step S10, a check is made for the state of transfer of the clock signal to the corresponding logic element activated in synchronism with the clock signal in each of the regions #1 through #6 to examine whether a clock skew exists. If the operation of the entire LSI logic circuit 1 falls within an extent free of a problem (the clock skew value falls within the allowable range) even if no clock skew occurs or the clock skew exists, then no problem occurs in the clock trees set in Steps S0 through S9. Therefore, the routine procedure is terminated without any problem upon wiring layout for the clock signals. If some problem arises (the clock skew value falls outside the allowable range), then the routine procedure is returned to Step S6, where the above-described processing is re-executed and the clock skew is set so as to fall within the allowable range. At this time, the wiring lengths for the clock trees between the regions #1 through #6 are first adjusted in Step S6 to make adjustments to the skew value. If each clock grid region between the adjacent subregions is left as described above, then the wiring lengths can be easily adjusted. When the clock skew value does not meet the allowable range even in this case, the wiring lengths are adjusted by changing the layout of the drivers (corresponding to the drivers 161 through 165 in the present embodiment) used for the clock trees between the regions #1 through #6 and the connections between the drivers. Basically, this is because the clock trees in the respective regions #1 through #6 are general in that the pre-ensured delay and clock skew value are constructed as a data base and the clock trees in the respective regions #1 through #6 do not need above adjustments. Thus, since the adjustment to the clock skew value does not need to be viewed over the entire LSI logic circuit 1, its adjustment can be also easily carried out.

Figure 7:
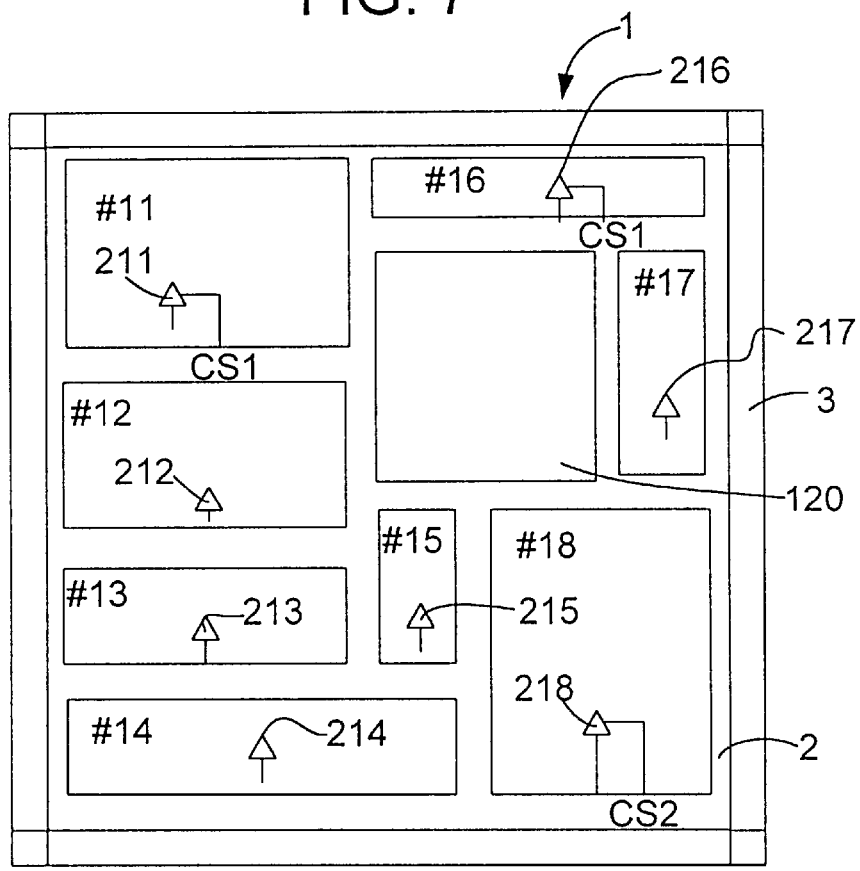
FIG. 7 is a view for describing the setting of main drivers in subregions employed in an application of the present invention.
Figure 8:
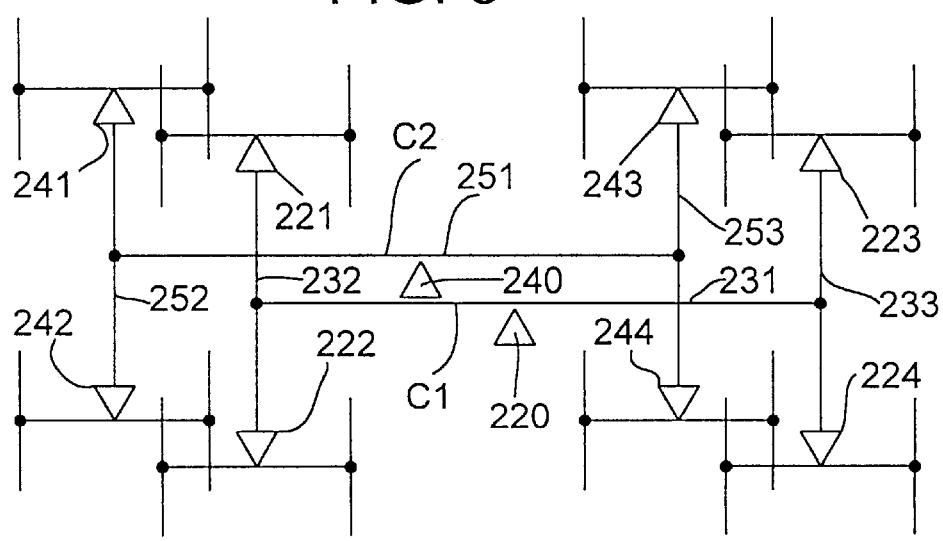
FIG. 8 is a view for explaining a wiring layout to which an H-type clock tree system employed in another application of the present invention is applied.

Examples to which the embodiment of the present invention is applied, will next be described below with reference to the accompanying drawings. FIGS. 7 and 8 show the present applications. FIG. 7 is a view showing a chip for an LSI logic circuit 1. FIG. 8 is a view illustrating H-type clock trees created by the application.

Now consider in FIG. 7 where, of the main drivers set in Step S4 in the respective regions in FIG. 7, for example, drivers whose outputs are controlled in response to control signals, are needed. Main drivers 211 and 216 in regions #11 and #16 in FIG. 7 are respectively controlled by a control signal CS1, and a main driver 218 in a region #18 is controlled by a control signal CS2. Further, other regions #12, #13, #14, #15 and #17 respectively include main drivers 212, 213, 214, 215 and 217 non-controlled by their corresponding control signals. In the present invention even in this case, if wiring regions for transfer of the control signals CS1 and CS2 are simply set in Step S3 and the type (whether or not the output is controlled by each of the control signals) of main driver is registered in Step S4, then such a case can be handled easily. If it is unnecessary to set the wiring regions for the control signals in Step S3, then the wiring regions other than the clock grid regions may be used.

When separate clock signals C1 and C2 are used as shown in FIG. 8, the attribute of each clock grid region may be set in Step S3 as described above. If done in this way, the wiring can be easily set without any collision between the clock signals C1 and C2. Now consider that, or example, the clock signal C1 is transferred through hi, 3, v1 and v3 shown in FIG. 3 and the clock signal C2 is transferred through h2, h4, v2 and v4 as in the embodiment. At this time, the wiring regions 130-2 and 130-5 indicated by h1 and h3 are used as a transversely-extending interconnection 231 corresponding to an interconnection extending from a driver 220 supplied with the clock signal C1 to drivers 221 through 224, whereas the wiring regions 140-1 and 140-5 indicated by v1 and v3 are used as longitudinally-extending interconnections 232 and 233 respectively. Similarly, the wiring regions 130-3 and 130-6 indicated by h2 and h4 are used as a transversely-extending interconnection 251 corresponding to an interconnection extending from a driver 240 supplied with the clock signal C2 to respective drivers 241 through 244, whereas the wiring regions 140-3 and 140-6 indicated by v2 and v4 are used as longitudinally-extending interconnections 252 and 253 respectively. Thus, the setting of the attribute in Step S3 can respond easily to the separate clock signals.

Figure 9:
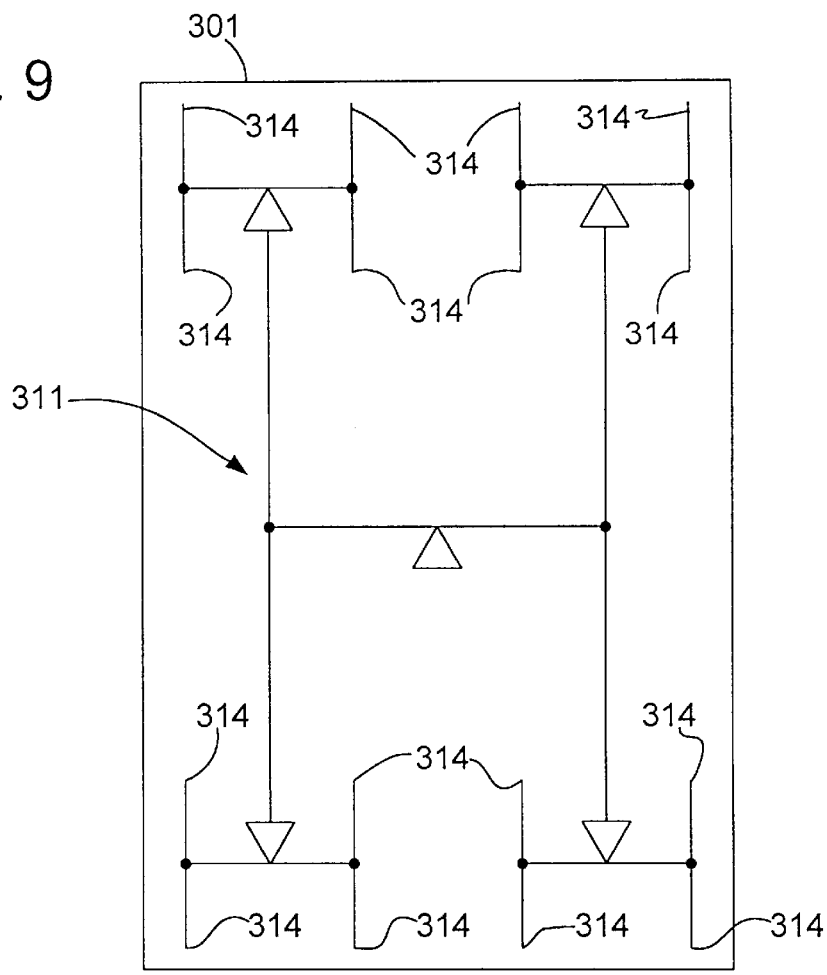
FIG. 9 is a view showing an H-type clock tree fabricated by a prior art method, for explaining an improvement in H-type clock tree system of the present invention.
Figure 10:
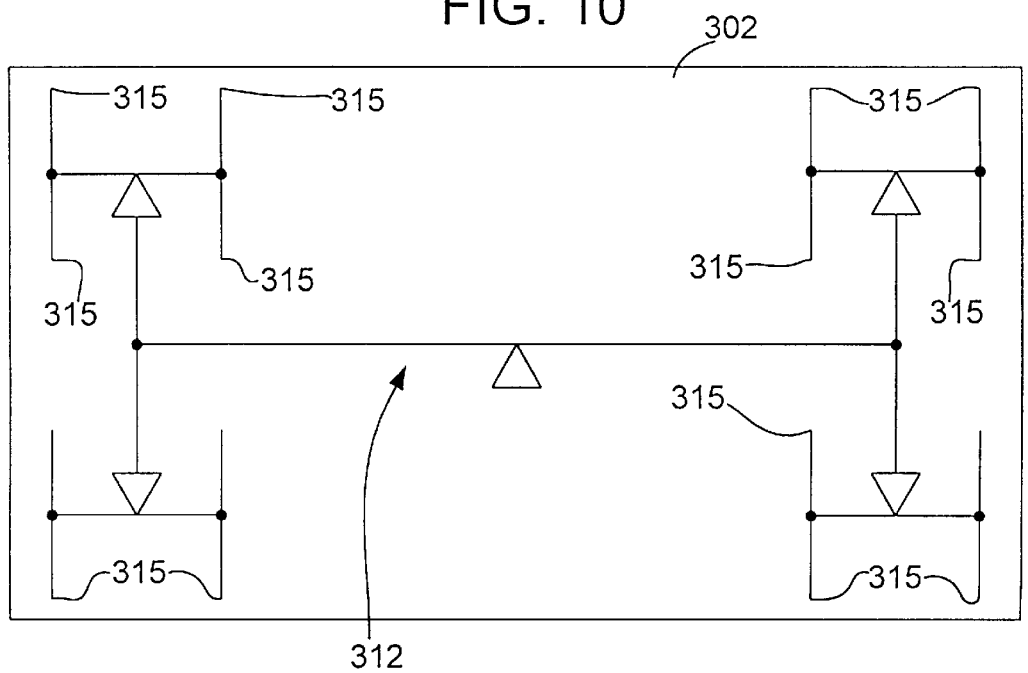
FIG. 10 is a view illustrating another H-type clock tree fabricated by the prior art method, for explaining an improvement in H-type clock tree system of the present invention.

FIGS. 9 through 16 respectively show improved examples of H-type clock tree systems. FIGS. 9 and 10 are respectively views of H-type clock trees which have heretofore been used. FIG. 9 shows an example in which an H-type clock tree 311 is formed in a longitudinal region 301. FIG. 10 illustrates an example in which an H-type clock tree 312 is formed in a transverse region 302. Logic elements are respectively provided at leading ends 314 of an H-type interconnection shown in FIG. 9 and leading ends 315 of an H-type interconnection shown in FIG. 10. The normal H-type clock tree is created so that interconnections are linearly symmetrical with each other in the form of an H. Therefore, even if the number of drivers may be three, for example (the number of logic elements wired in the form of the H-type clock tree is eight), interconnections corresponding to 16 logic elements are created as shown in FIG. 9 and 10. This results in the occupancy of the regions #1 through #6 by the unnecessary interconnections and will lead to an increase in wiring load.

Figure 11:
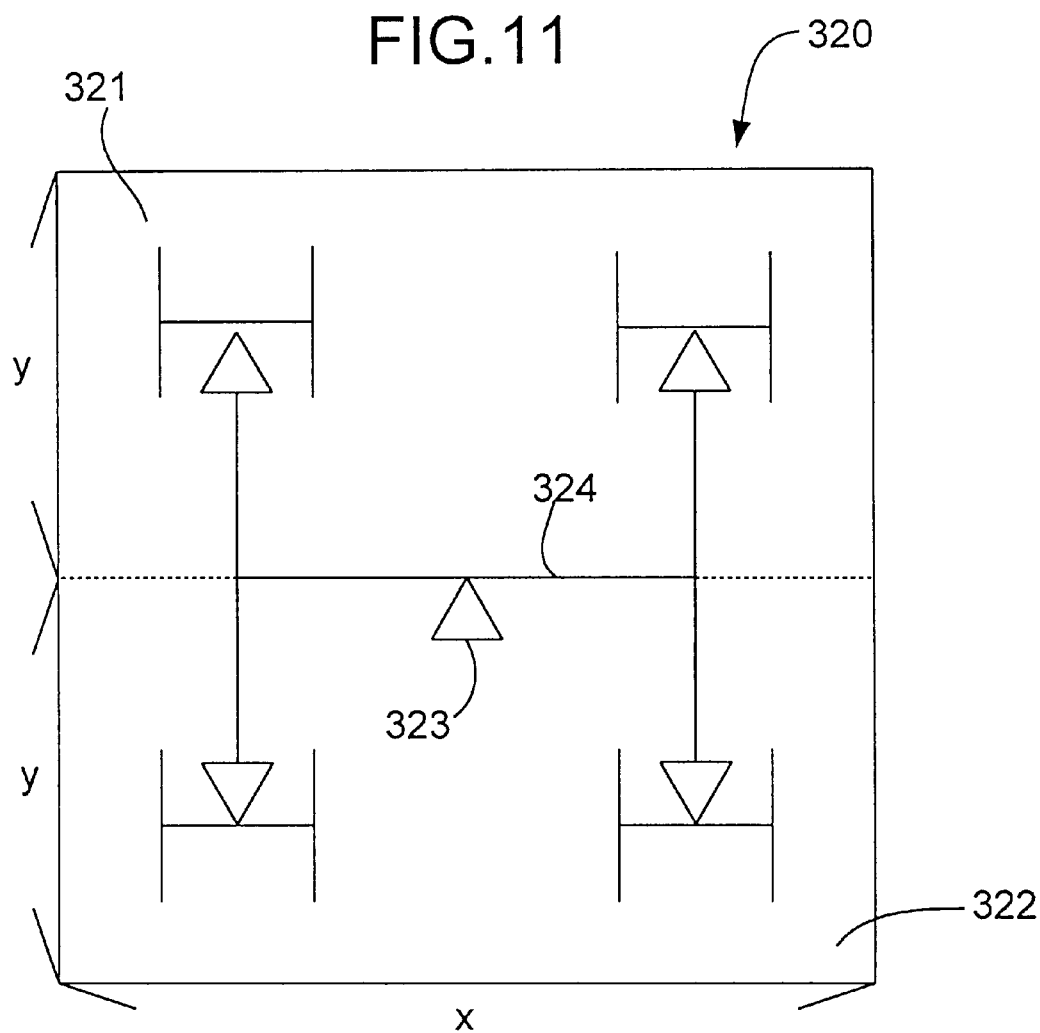
FIG. 11 is a view for describing a wiring layout based on the improved H-type clock tree system of the present invention.
Figure 12:
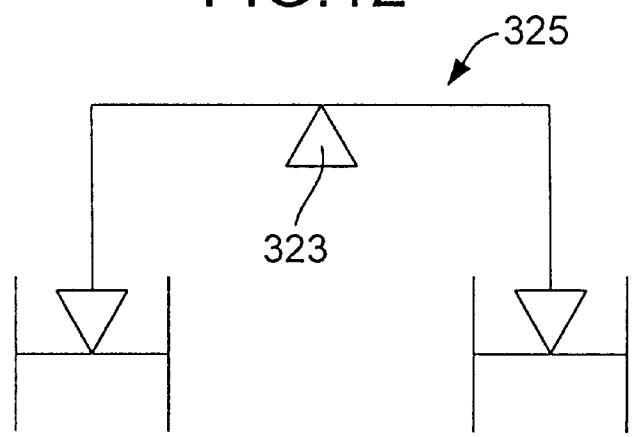
FIG. 12 is a view showing a clock tree fabricated in accordance with the wiring layout based on the improved H-type clock tree system of the present invention.

Therefore, the present invention will illustrate the following improvement. FIG. 11 is a view for describing the creation of an H-type clock tree illustrative of its improved example. Now consider where it is desired to form an H-type clock tree in a transversely-long region like a region 322 in which the vertical length thereof is y and the horizontal length thereof is x (=2y) in FIG. 11. An H-type clock tree is first created with this region as a square region 320 whose vertical and horizontal lengths are x. Namely, a region 321 is set as a virtual region. Since the H-type clock tree created within the region 320 is formed as is described in the conventional method, this is one in which interconnections are linearly symmetrical with each other in H form. Next, only the region 322 in which the main driver 323 of this clock tree is disposed, is taken out or extracted from the region 320. This extracting process can be executed by deleting information about the interconnections for the region 321 and the drivers. At this time, information about an interconnection 324 at the boundary must be left. As a result, a clock tree 325 with three drivers can be created as shown in FIG. 12.

Figure 13:
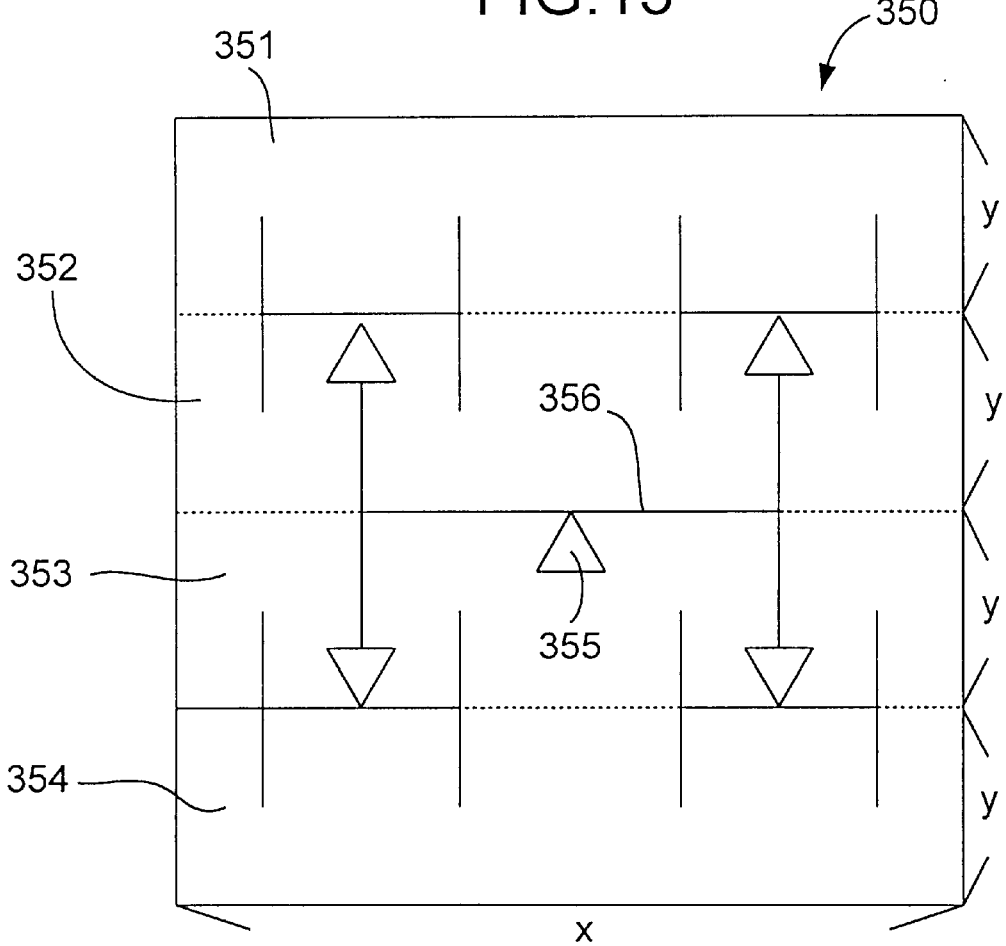
FIG. 13 is a view for describing another example of the wiring layout based on the improved H-type clock tree system of the present invention.
Figure 14:
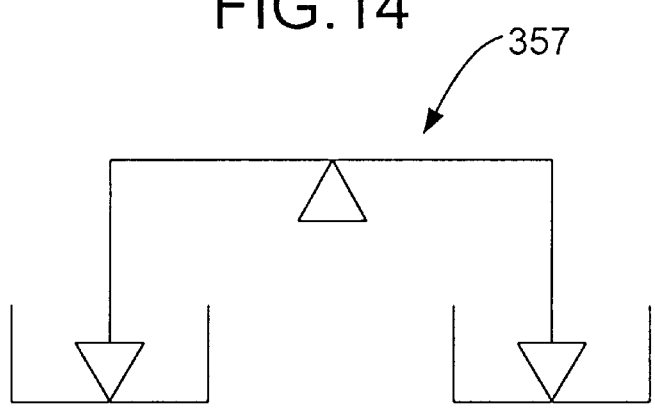
FIG. 14 is a view showing a clock tree created by the example of the wiring layout based on the improved H-type clock tree system of the present invention.
Figure 15:
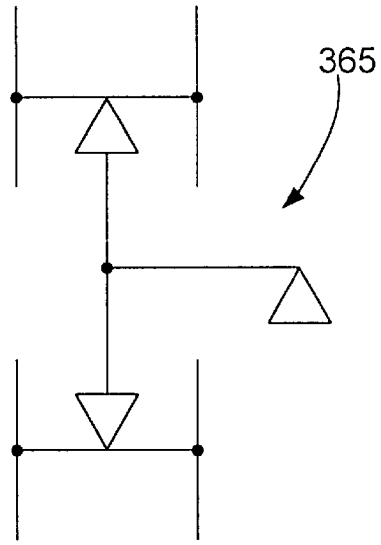
FIG. 15 is a view illustrating a clock tree fabricable by an application of the wiring layout based on the improved H-type clock tree system of the present invention.
Figure 16:
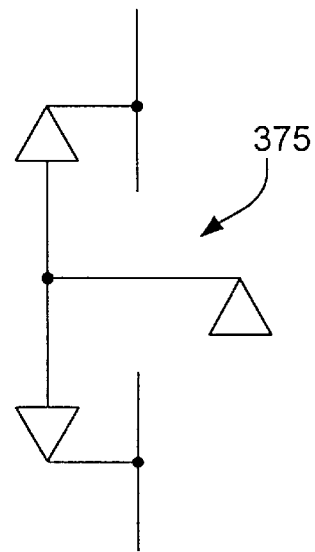
FIG. 16 is a view depicting another clock tree fabricable by the application of the wiring layout based on the improved H-type clock tree system of the present invention.

Further, the processing similar to the above can be done even when it is desired to create an H-type clock tree within a transversely-long region like a region 353 in which the vertical length is y and the horizontal length is x (=4y) as shown in FIG. 13. An H-type clock tree is first created with this region as a square region 350 whose vertical and horizontal lengths are both x. Namely, regions 351, 352 and 354 are set as virtual regions. Since the H-type clock tree created within the region 350 is formed as is described in the conventional method, this is one in which interconnections are linearly symmetrical with each other in H form. Next, only the region 353 in which the main driver 355 of this clock tree is laid out, is taken out or extracted from the region 350. This extracting process can be done by deleting information about the interconnections for the regions 351, 352 and 354 and the drivers. At this time, information about an interconnection 356 at the boundary must be left. As a result, a clock tree 357 with three drivers can be created as shown in FIG. 14.

FIGS. 11 through 14 show the case in which the horizontal length x and the vertical length y indicate the region expressed by $x=2^n*y$ (where n: integer greater than or equal to 1). However, a region expressed by $y=2^n*x$ can be also handled in the same manner as described above. If y=2x in this case, then a tree 365 shown in FIG. 15 can be created. If y=4x, then a tree 375 shown in FIG. 16 can be created.

Thus, the improvement in H-type clock tree allows prevention of the regions #1 through #6 from being occupied and the wiring load from increasing by the unnecessary interconnections. Further, when the floor plan is designed in Step S1, the degree of freedom of the configuration of each region thereof can be increased.

Further, in the present invention, variations in parallel plate capacitance and fringe field capacitance with respect to each clock interconnection can be restricted by aligning a region for a reference potential supply line, e.g., a ground potential supply line with its corresponding clock grid region and placing it in another layer. Thus, a delay in clock signal and a clock skew thereof can be expected to be further reduced. When the clock grid region is defined by the region 130-2 of the third layer as viewed in the horizontal direction thereof and the region 140-1 of the fourth layer as viewed in the vertical direction thereof in FIG. 3, for example, the region for the ground potential supply line may be defined by the same position in the first layer as that of the region 130-2 as viewed in the horizontal direction thereof and the same position in the second layer as that of the region 140-1 as viewed in the vertical direction. This may be defined in a suitable Step after the setting of each clock grid region.

After the clock grid region has been set in Step S2, other signal interconnections wired in the neighborhood of the clock grid region are further specially defined so as to be spaced by a predetermined interval from the clock grid region. Alternatively, other signal interconnections may be specially defined so as to be spaced by a predetermined interval from each clock signal interconnection after the clock interconnections have been set after Steps S6 and S8. This definition can restrict coupling capacitance with respect to the interconnection for each clock signal. Even by this definition, a delay in clock signal and a clock skew thereof can be expected to be further reduced. This may be also defined in a suitable Step subsequent to the setting of each clock grid region.

If a CAD system is used, then the present invention can basically be handled using a CPU and a memory or the like by program processing. However, processing means for each Step may be provided as hardware.

Figure 17:
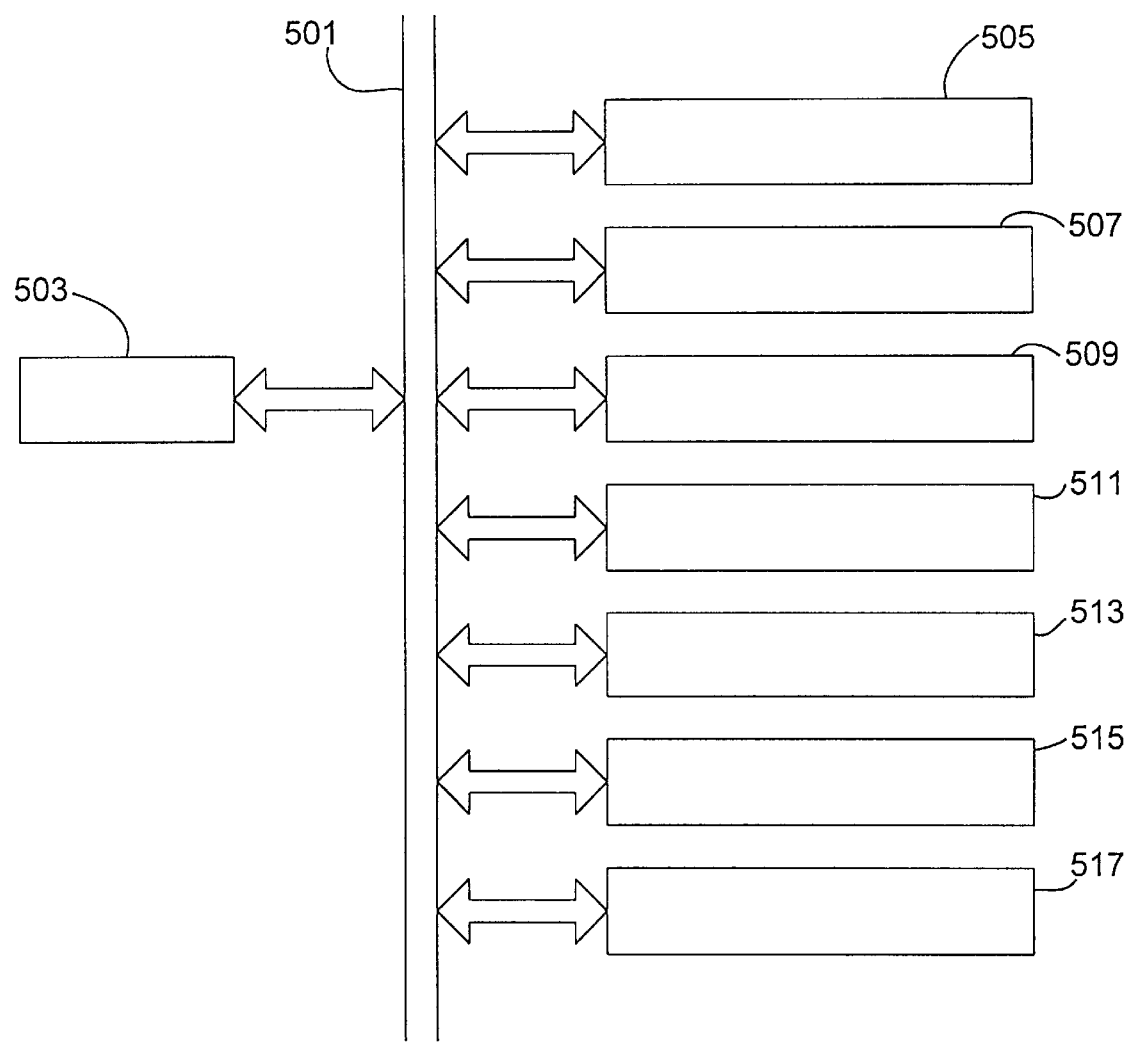
FIG. 17 is a schematic view of a system for implementing a wiring layout method of the present invention.
Figure 18:
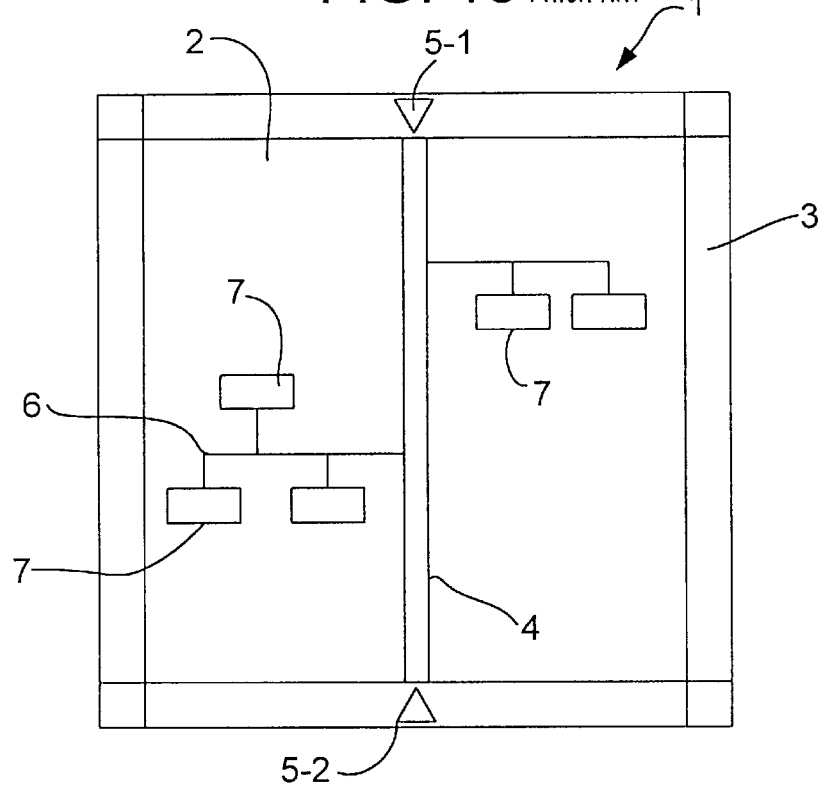
FIG. 18 is a view for explaining a trunk system corresponding to one of conventional wiring layout methods.
Figure 19:
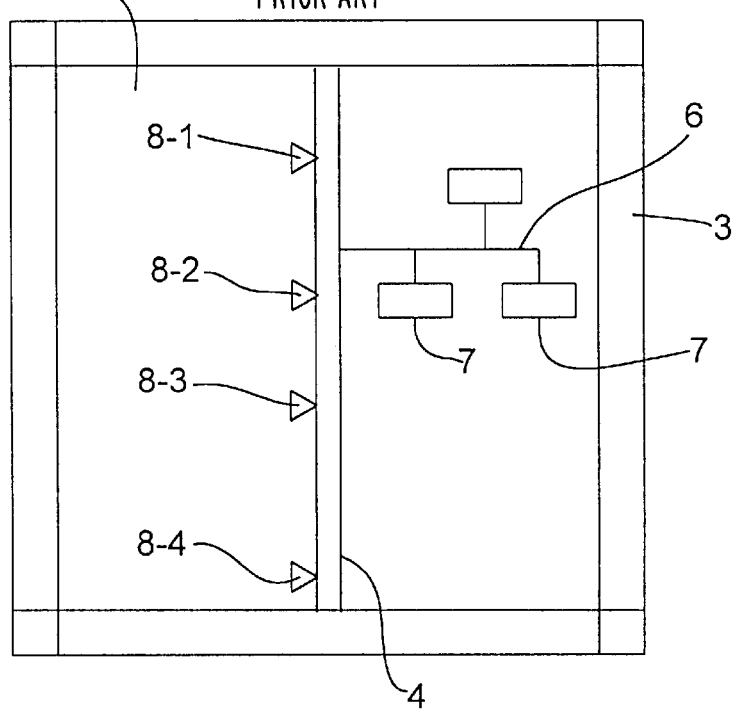
FIG. 19 is another view for explaining the trunk system corresponding to one of the conventional wiring layout methods.
Figure 20:
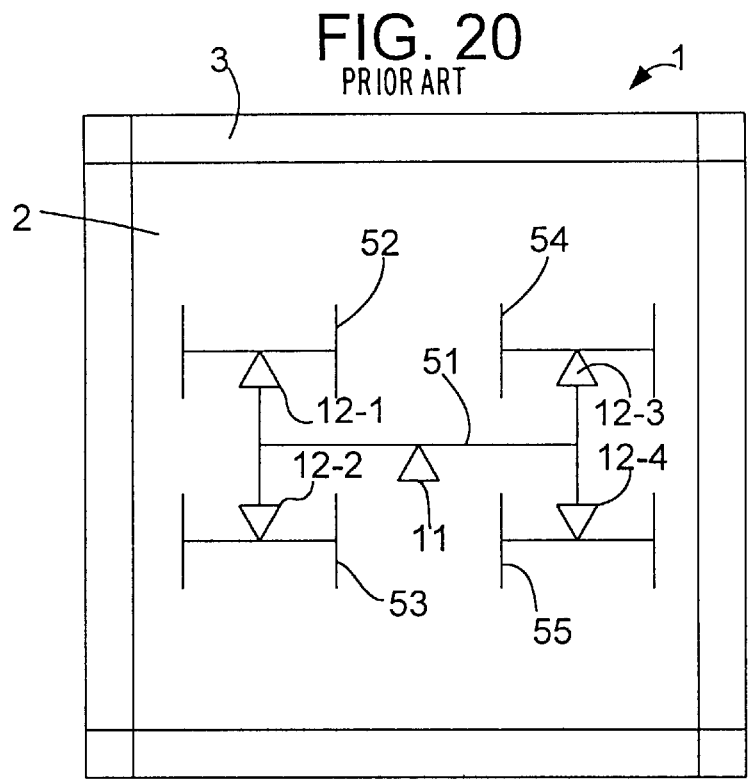
FIG. 20 is a view for explaining an H-type tree system corresponding to one of the conventional wiring layout methods.
Figure 21:
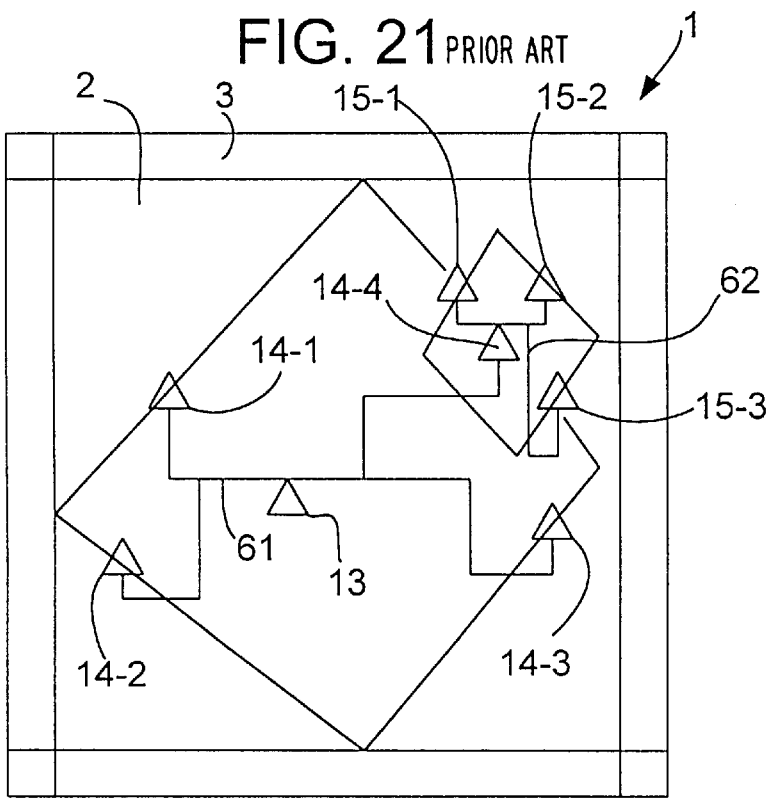
FIG. 21 is a view for describing a rhombic tree system corresponding to one of the conventional wiring layout methods.
Figure 22:
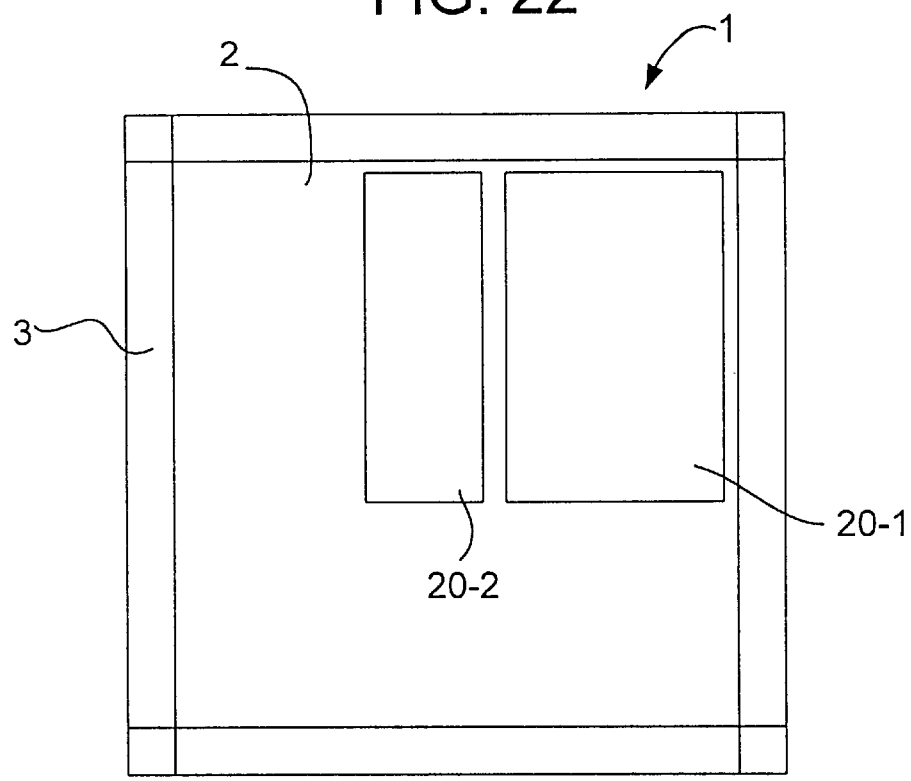
FIG. 22 is a view for describing a problem on a conventional wiring layout method.
Figure 23:
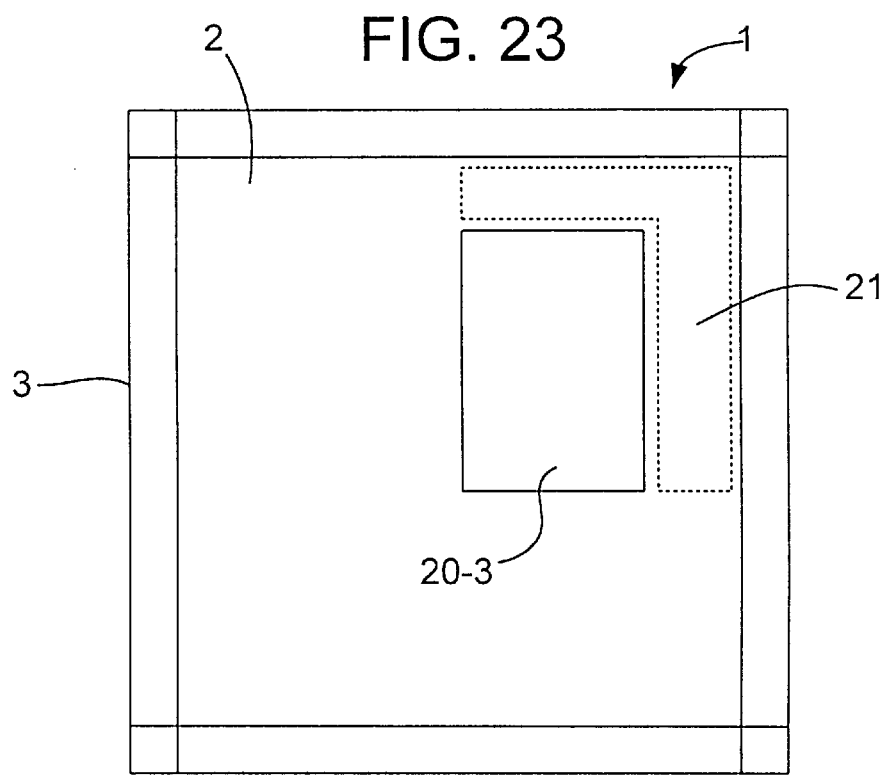
FIG. 23 is another view for describing the problem on the conventional wiring layout method.

For example, a CAD system shown in FIG. 17 is provided with an input means 505, a clock grid setting means 507, a driver disposing or laying out means 509, a wiring means 511, a skew value verifying means 513 and a storing means 515 all controlled by a control means 503 through a signal line group 501 for transferring various control signals and information or the like. The input means 505 is used to input the information and the set floor plan in Step S0, the information about the positions of the cells and the flip-flops in Step S7, and the information for setting other interconnections in Step S9. The input information may be stored in the storing means 515 under the control of the control means 503 as needed. The clock grid setting means 507 is used to set each clock grid and the attribute thereof in Steps S2 and S3. The clock grid setting means 507 performs the above-described processing. At this time, the clock grid setting means 507 can apply the information stored in the storing means 515, using the input means 505 as needed. The contents set here may be stored in the storing means 515 or simply displayed on a display means 517 if necessary. The driver laying out means 509 is used to place or lay out the respective drivers and set the number of the driver's stages in Steps S4, S5, S6 and S8. In a manner similar to the clock grid setting means 507, the driver laying out means 509 can apply the information stored in the storing means 515, using the input means 505 as necessary. The clock wiring means 511 is used to wire between the drivers in Steps S6 and S8. The clock wiring means 511 can also apply the information stored in the storing means 515, using the input means 505 as needed. The skew value verifying means 513 is used to verify the skew value in Step S10. Although means used in Steps S1 and S9 are not shown in the drawing, the system shown in FIG. 17 has been described so that the floor plan in Step S1 and the setting of other interconnections in Step S9 are executed by an external device or the like and information sent from the external device or the like is inputted through the input means 505. Even if the means used for Steps S1 and S9 are provided, no problem arises.

Due to the construction of the respective processing means by hardware as described above, the method according to the present invention can be implemented without the need for programs.

Although the present embodiment has described the clock signals as examples, it is naturally applicable to signals other than the clock signals. Further, the present invention may be applied for the design of a logic circuit free of a configuration like a macrocell.

According to the application of the wiring layout method of the present invention, as has been described in detail above, a region in which logic elements to be activated in synchronism with a predetermined signal are placed, is divided into a plurality of subregions in advance. As a result, the number of interconnections and the number of drive elements can be uniformly set within the subregions and between the respective subregions separately. The shortest wiring route can be easily determined by ensuring wiring regions for the predetermined signal in advance. Thus, even if the configuration like the macrocell is disposed in any way, the respective logic elements to be activated in synchronism with the predetermined signal can be easily laid out and wired and a wiring delay in this signal and a clock skew thereof can be reduced as small as possible.

Further, a wiring system like a conventional tree system can be easily applied within respective rectangular regions by dividing a region to be laid out for wiring into a plurality of rectangular regions in advance. Since an H tree system can be adopted within the respective subregions in particular, interconnections uniform in wiring length, which extend to each driver element in the next stage, can be easily set.

Further, since the conventional tree system is improved into the H-type tree system and interconnections between drive elements designed in the H-type tree system can be selectively adopted, unnecessary interconnections and drivers can be easily deleted. Thus, the regions to which the layout of wiring by the H-type tree system is applied, are not occupied by the unnecessary interconnections and drivers. Further, the degree of freedom of the layout of the interconnections and the drive elements can be further improved and loads developed due to the unnecessary interconnections and drivers can also be reduced.

Moreover, since a region for a reference potential supply line is aligned with a wiring region used to transfer a predetermined signal and the region is placed in a wiring layer different from a wiring layer for disposing or laying out the wiring region, variations in parallel plate capacitance and fringe field capacitance of each interconnection for the predetermined signal can be restrained. As a result, a delay in predetermined signal and a skew thereof can be reduced.

Since other signal interconnections wired in the neighborhood of the wiring region used for the transfer of the predetermined signal are set so as to be spaced by a predetermined interval from the wiring region used for the transfer of the predetermined signal after the setting of the wiring region, coupling capacitance of an interconnection for the predetermined signal can be restrained. Thus, a delay in predetermined signal and a skew thereof can be expected to be reduced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments that fall within the true scope of the invention.

What is claimed is:

1. A method of laying out interconnections employed in an LSI logic circuit having a pluralitu of logic elements within a preset regiion of an LSI chip, the plurality of logic elements being respectively activated in synchronism with at least one predetermined signal through one or more drive elements, said method comprising:

dividing the region into a plurality of subregions;

setting, within the individual subregions, the number of drive elements to be interposed between an input position of the signal to the respective subregions and a transfer position of the signal to the logic elements within the region;

setting drive elements, for sypplying the predetermined signal between the subregions, by grouping the subregions based on the number of driving elements in the respective subregions wherein said drive elements are set between subregions with the same number of driving elements or between subregions with the closest number of driving elements;

wiring between the drive elements, which are operable to supply the at least one predetermined signal, using predetermined wiring regions; and setting wiring between the drive elements set in the subregions using the layout of the respective drive elements in the individual subregions and the set wiring regions.

2. A method according to claim 1, wherein the layout of the drive elements in the individual subregions and the wiring between the drive elements are conducted using an H-type clock tree.

3. A method according to claim 2, further including:

configuring the H-type clock tree within a substantially square region in which the region is dividable into $2^n$ in the vertical or horizontal direction; and selecting only a divided region including main drive elements of the configured H-type clock tree.

4. A method according to claim 1, further including:

aligning a region for a reference potential supply line with the wiring regions used to transfer the signal and placing the region for the reference potential supply line in a wiring layer different from a wiring layer for laying out the wiring regions.

5. A method according to claim 4, wherein the layout of the drive elements in the individual subregions and the wiring between the drive elements are conducted using an H-type clock tree.

6. A method according to claim 5, further including:

configuring the H-type clock tree within a substantially square region in which the region is dividable into $2^n$ in the vertical or horizontal direction; and selecting only a divided region including main drive elements of said configured H-type clock tree.

7. A method according to claim 1, further including:

setting other signal interconnections wired in the neighborhood of the wiring regions so as to be spaced by a predetermined interval from the wiring regions after the wiring regions used for the transfer of the signal have been set.

8. A method according to claim 7, wherein the layout of the drive elements in the individual subregions and the wiring between the drive elements are conducted using an H-type clock tree.

9. A method according to claim 8, further including:

configuring the H-type clock tree within a substantially square region in which the region is dividable into $2^n$ in the vertical or horizontal direction; and selecting only a divided region including main drive elements of said configured H-type clock tree.

10. A method according to claim 1, further including:

setting wiring regions used for the transfer of the signal within the region for setting said predetermined wiring regions.

* * * * *